(12) United States Patent
Martin et al.

(10) Patent No.: US 8,160,123 B2
(45) Date of Patent: Apr. 17, 2012

(54) DEVICE FOR RECEIVING SATELLITE SIGNALS INCLUDING A PHASE LOOP WITH DELAY COMPENSATION

(75) Inventors: Nicolas Martin, Bourg les Valence (FR); David Depraz, Valence (FR); Patrice Guillard, Valence (FR)

(73) Assignee: Thales (FR)

( * ) Notice: Subject to any disclaimer, the term of this patent is extended or adjusted under 35 U.S.C. 154(b) by 316 days.

(21) Appl. No.: 12/527,452

(22) PCT Filed: Mar. 10, 2008

(86) PCT No.: PCT/EP2008/052826
§ 371 (c)(1),
(2), (4) Date: Sep. 25, 2009

(87) PCT Pub. No.: WO2008/113708
PCT Pub. Date: Sep. 25, 2008

(65) Prior Publication Data
US 2010/0103988 A1 Apr. 29, 2010

(30) Foreign Application Priority Data
Mar. 16, 2007 (FR) ...................... 07 01931

(51) Int. Cl.
*H04B 1/00* (2006.01)
(52) U.S. Cl. ........ 375/149; 375/150; 375/343; 375/371; 327/147; 327/156
(58) Field of Classification Search .................. 375/134, 375/137, 145, 149, 371–376, 150, 343; 327/141, 327/147–150, 156–159, 163
See application file for complete search history.

(56) References Cited

U.S. PATENT DOCUMENTS
6,982,669 B2    1/2006    Coatantiec et al.
(Continued)

FOREIGN PATENT DOCUMENTS
WO    WO 2004/105248    12/2004

OTHER PUBLICATIONS

Hinedi, S., et al., "Digital Accumulators in Phase and Frequency Tracking Loops", IEEE Transactions on Aerospace and Electronic Systems, IEEE Service Center, Piscataway, NJ, US, vol. 26, No. 1, Jan. 1, 1990, pp. 169-180, XP000104247, ISSN: 0018-9251.

(Continued)

*Primary Examiner* — Curtis Odom
(74) *Attorney, Agent, or Firm* — Lowe Hauptman Ham & Berner, LLP

(57) ABSTRACT

Described is a device for receiving radio-navigation signals by satellite, said received signals being transmitted at a carrier frequency. The device includes at least means for generating a local signal at a local frequency and a tracking device including a feedback loop called carrier loop for phase-locking the local frequency on the carrier frequency. The loop includes a hardware portion and a software portion. The software portion performs the functions of discrimination of the phase of the correlated signal and filtering of said phase. The software portion also includes correlation functions mainly dependent on the linear variation coefficients between the local phases $\phi_{local}$ delivered after each basic computation cycle. The device makes it possible to increase the loop band and the dynamic stability without changing the pre-detection band and the workload of the software.

10 Claims, 9 Drawing Sheets

U.S. PATENT DOCUMENTS

| | | | |
|---|---|---|---|
| 7,064,707 B2 | 6/2006 | Martin | |
| 7,180,445 B2 | 2/2007 | Martin et al. | |
| 7,295,635 B2 | 11/2007 | Coatantiec et al. | |
| 7,504,996 B2 | 3/2009 | Martin | |
| 2003/0085839 A1* | 5/2003 | Zhodzishky et al. | 342/357.12 |
| 2003/0231580 A1 | 12/2003 | Martin et al. | |
| 2004/0260456 A1 | 12/2004 | Martin et al. | |
| 2006/0097915 A1 | 5/2006 | Martin et al. | |
| 2009/0027261 A1 | 1/2009 | Martin et al. | |

OTHER PUBLICATIONS

U.S. Appl. No. 11/628,864, filed Dec. 8, 2006, Martin et al., (Not Published, Abandoned).

U.S. Appl. No. 10/413,132, filed Apr. 11, 2003, Damien Korpet et al., (Not Published, Abandoned).

U.S. Appl. No. 12/280,698, filed Aug. 16, 2008, Martin et al. (Not Yet Published).

* cited by examiner

Without data:

With data:

DEVICE FOR RECEIVING SATELLITE SIGNALS INCLUDING A PHASE LOOP WITH DELAY COMPENSATION

CROSS-REFERENCE TO RELATED APPLICATIONS

The present Application is based on International Application No. PCT/EP2008/052826, filed on Mar. 10, 2008, which in turn corresponds to French Application No. 0701931, filed on Mar. 16, 2007, and priority is hereby claimed under 35 USC §119 based on these applications. Each of these applications are hereby incorporated by reference in their entirety into the present application.

BACKGROUND OF THE INVENTION

1. Field of the Invention

The technical field of the invention is that of satellite radio-navigation. It concerns the current "GPS" system, GPS being an acronym for global positioning system, and the future "Galileo" system. The technical field involved is more particularly that of the demodulation means for the receptions systems.

2. Description of the Prior Art

Satellite radio-navigation makes it possible to obtain the position of a signal receiver by a resolution similar to triangulation, using the pseudo-distances measured on the basis of the signals sent by several satellites. Each satellite transmits a signal made up of a sinusoidal carrier, the frequency of which is between 1.2 and 1.6 GHz. This carrier is modulated by a binary spreading code, the frequency of which is between 1 and 10 MHz.

FIG. 1 represents a first transmitted signal S modulated by its spreading code C.E. The first graph of FIG. 1 represents the sinusoidal variations of the initial carrier P as a function of time t, the second represents the spreading code C.E., the third represents the carrier modulated by its spreading code S, the fourth the self-correlation function A of the local code, and finally the fifth graph represents its power spectrum as a function of the frequency f.

The carrier can also be modulated by data bits, the frequency of which is between 1 Hz and 50 Hz. The spreading sequence has a period varying from one millisecond to a week. It is specific to each satellite and the sequences are decorrelated between the different satellites, so that they can be dissociated in the received signal.

A signal transmits either a data signal alone, or a data signal and a "pilot" signal that is not modulated by data bits.

The receiver includes a receiving antenna and means of demodulating the signals transmitted by the visible satellites. These demodulation means correlate the signal received by the antenna with a local carrier and a local code specific to each satellite. It is the sequence of the local code, identical to that of the received satellite, which enables the receiver to choose the tracked satellite.

To synchronize the local code and the local carrier on the signal received from the satellite contained in the signal received by the antenna, the receiver uses in parallel two tracking devices which are a code loop and a carrier loop. The functional block diagrams of these loops are represented in FIG. 2 and are detailed hereinbelow.

The code loop is used to position a local code in phase with the code contained in the received satellite signal S so as to produce a correlation giving the maximum energy.

The carrier loop is used to lock the frequency or the phase of the local carrier with respectively the frequency or the phase of the received carrier, in order to maximize the result of the correlation.

The presence of a signal at the output of the correlation with a high amplitude, that is to say significantly greater than what the ambient noise would give in the absence of satellite signal, means that the local code and the local carrier are synchronized on the received signal, which makes it possible to measure, at each instant, the transmission time and the Doppler of the received signal, via the phase of the local code and the speed of the phase of the local carrier.

The initial synchronization of the phase of the local code and of the local carrier on the signal received from the satellite is performed in a preliminary "acquisition" phase. This phase is not detailed in this description because it represents a departure from the inventive device. It is well known to those skilled in the art and does not pose any particular difficulties. As a general rule, it consists in searching for energy by scanning an area of uncertainty code-wise and Doppler-wise until the correlation gives an adequate signal level.

More specifically, as indicated in FIG. 2, the code loop uses at least two correlation channels, with a local code leading and a local code lagging relative to the reference code of the one-off channel, the local carrier being common to all three channels. These correlation channels are represented by the three arrows issuing from the correlation integrator $I_{COR}$. The loop seeks to equalize the levels at the output of the two correlation channels by feedback on the phase of the local code using:

- a code generator $G_C$;
- a correlation integrator $I_{COR}$ which performs the integration of the correlation;
- a code discriminator $D_C$ which measures the energy difference between the two channels;
- a loop corrector $C_C$ which filters the discriminator and produces a speed correction;
- a numerical control operator, also called NCO, which converts the speed command into a local code phase.

When the two levels are equal, the reference code of the one-off channel is in phase with the received satellite code, which ensures a maximum of efficiency in the correlation on this channel, excluding the loss due to the Doppler effect, if the frequency of the local carrier is not correctly locked onto that of the received carrier.

There are two types of carrier loop: frequency loops and carrier phase loops.

A frequency loop is used to match the frequency of the local carrier with that of the received carrier, firstly to maximize the signal collected after the correlation and secondly to supply a Doppler measurement to the tracked satellite.

A phase loop is used to lock the phase of the local carrier onto the phase of the received carrier to within modulo $2\pi$ in order to improve the accuracy of the code measurement thanks to a smoothing of the code by the phase of the carrier. A phase loop provides much richer information than a frequency loop, because the trends of the measured carrier phase very accurately reflect the trends of the pseudo-distances, without drift, unlike the measurements of an integrated frequency loop. It is this property which is used to greatly enhance the accuracy of the code measurement by filtering over a very long time. The difference between the code pseudo-distance measurement and the carrier pseudo-distance measurement is filtered and then the phase measurement of this filtered difference is corrected to find a very accurate code measurement.

A carrier phase loop, also called PLL, standing for phase-locked loop, uses the one-off correlation channel and locks the phase of the local carrier onto the phase of the received carrier by a feedback on the local phase thanks to:
- a phase discriminator $D_P$ which measures the difference between the local phase and the received phase;
- a loop correlator $C_P$ which filters the discriminator and produces a speed correction;
- a carrier NCO which converts the speed command into a local carrier phase $P_L$.

In fact, the NCO command is the image of the Doppler and the NCO produces a phase at the frequency $f_{code}$ or $f_{carrier}$ called heel, augmented by the Doppler speed command, positive or negative.

The performance criteria of the tracking loops are:
- accuracy;
- robustness. Robustness should be understood to mean the capacity of a loop to remain attached and therefore to limit the phase error within a bounded range. The factors affecting robustness are:
  - the various noises that can be ambient thermal noise, noise due to interference, attenuation of the wanted signal, etc.;
  - the dynamic range due to the movement of the carrier or to clock defects.

Thanks in particular to the smoothing of the code by the carrier, the accuracy of a few tens of centimeters of the code is generally sufficient as long as the phase loop remains attached.

Similarly, the carrier accuracy of a few millimeters is sufficient for most applications.

The code loop is assisted in speed by the carrier loop, the code NCO command being the sum of the output of the code corrector and of the carrier NCO command as can be seen in FIG. 2, this sum being symbolized by the ringed+symbol. The code loop can have a narrow bandwidth, the robustness of the code loop to noise and to dynamics being linked to that of the carrier. As long as the carrier remains attached, the code loop remains attached and the accuracy remains good. As for the robustness of the receiver, its weak point is therefore the carrier phase loop. To improve noise resistance, it would be necessary to minimize its bandwidth. To improve dynamic resistance, it would be necessary to maximize its bandwidth. A trade-off is therefore required.

In current receivers, the implementation of the tracking loops is divided into two components:
- one part working at high frequency implemented by electronic components of the ASIC or FPGA type, the working frequency ranging from 1 MHz to 100 MHz;
- one part working at low frequency implemented as software, the measurement frequency being situated around 50 Hz.

As an example, FIG. 3 represents a carrier loop. The hardware part is represented in the first broken-line rectangle on the left of FIG. 3. It comprises:
- a 0 order blocker $B_0$;
- a carrier NCO which is in fact a Doppler speed-driven integrator generating the carrier local phase;
- a sine and cosine trigonometric function table generating the local carrier $P_L$;
- a correlator Cor performing the correlation of the local signals with the received signal, symbolized by the ringed x symbol;
- integration means $I_{COR}$ working on intervals of duration T coinciding with the low frequency of the software.

The software part is represented in the second broken-line rectangle on the right of FIG. 3. The software part handles the driving of the NCOs, based on the result of the correlation produced at low frequency by the hardware part. It mainly comprises a phase discriminator $D_P$ and a code loop corrector $C_P$. Hereinafter in the description, T is used to denote the duration or cycle time of a basic task of the software.

The practical implementation of the tracking loops incurs two sources of delay:
- delay due to the time it takes for the software to compute the NCO command;
- delay due to the NCO which is driven speed-wise and not instantaneous phase-wise.

Since the code loop is assisted speed-wise by the carrier loop, it has a narrow bandwidth relative to the frequency of the loops, and these delays have no notable effect on the performance of the code loop.

However, the delays in the carrier loop have the unfortunate effect of rendering the behavior in closed loop mode unstable, which makes it necessary to maintain a small loop band in front of the pre-detection band $B_{FI}$ equal to 1/T which corresponds to the inverse of the working frequency of the software part. If the delays in the carrier phase loop are not compensated, a margin of stability between the pre-detection band and the loop band must be retained. This means having a smaller loop band and therefore a lesser dynamic resistance.

The delay due to the computation time can be minimized by optimizing the software architecture, but this incurs additional development costs, load peaks that are prejudicial to correct operation and uncertainty concerning the command application delay. FIG. 4 illustrates this delay. This figure represents the variations of the different phases as a function of the cycle time T. The time t is subdivided with N periods of duration T, each period being indexed nT, n being an integer. The first curve represents the local phase, the second curve represents the received phase. The trapezoid-shaped dotted area represents the argument of the complex signal $Z_p(n)$ obtained from the correlation integrator. The phase discriminator is represented by the angle $\theta(n)$. The slope of the local phase at the end of the computation time and during the application time is denoted $C(n+1)$. As can be seen in this FIG. 4, the delay due to the computation time $T_C$ leads to an uncertainty concerning the command application delay.

The delay due to the homing of the NCO can be cancelled by instantaneously repositioning the phase at the output of the NCO based on a command that would no longer be speed-oriented but hop-oriented. This point is illustrated in FIG. 5 using the same notations as previously. However, this is not compatible with the Doppler and would mean having to drive the NCO both hop-wise and speed-wise, hence a more complex receiver.

SUMMARY OF THE INVENTION

The proposed method makes it possible to increase the loop band and therefore the dynamic resistance without changing the pre-detection band and therefore the workload of the software.

It also makes it possible to reduce the pre-detection band without reducing the loop band that is dimensioned for a specified dynamic profile. The benefit of reducing the pre-detection band is to increase the signal-to-noise ratio at the discriminator level, which is useful when using the extended arc tangent, which is a dimensioning element for the loop's robustness to noise. The trade-off between robustness to noise and robustness to dynamics is thus enhanced.

The device according to the invention makes it possible to compensate these various delays. More specifically, the subject of the invention is a device for receiving radio-navigation signals by satellite, said received signals being transmitted at a first frequency called carrier frequency, said device comprising at least means for generating a local signal at a second frequency called local frequency and a tracking device including a feedback loop, called carrier loop, for phase-locking the local frequency on the carrier frequency, said feedback loop including a hardware portion and a software portion, said hardware portion comprising at least one integrator which performs the correlation between the local signal and the received signal, the signal deriving from the correlation being called correlated signal, said correlation being performed at high frequency, said software part performing functions of discriminating the phase of the correlated signal and filtering said phase, the software portion working at low frequency, the duration of a basic computation cycle being denoted T, each cycle being indexed by an integer number n so that the duration of a cycle is contained in the time interval [(n−1)T, nT], the correlated signal at the instant nT being denoted Zp(n), the signal θ(n) deriving from the discrimination being equal to the argument of the product $Z_R(n)$ of Zp(n) by a complex exponential function $Z_C(n)$, the argument of which is a compensation term that is a function of n and of T, characterized in that, if C(n) is used to denote the linear variation coefficient of the phase of the local frequency $\phi_{local}$ between the instants nT and (n+1)T such that $[\phi_{local}((n+1)T)-\phi_{local}(nT)]/T$ is equal to C(n), C(n) being calculated previously from data available respectively at the instant (n−1)T and concerning the value of the received phase, its position and its acceleration, then said compensation term depends at least on C(n) and C(n−1). More specifically, the compensation term is equal to the opposite of the sum of C(n) and ½ C(n−1).

Advantageously, when the received signal does not include data, an extended discriminator or winder is used, the signal θ(n) obtained from the discrimination being equal to the signal θ(n−1) plus the argument taken over the interval [−π, +π] of the product of the complex functions $Z_R(n)$ and $Z_R(n-1)^*$. Also, when the received signal includes data, the signal θ(n) obtained from the discrimination is equal to the signal θ(n−1) plus the argument taken over the interval [−π/2, +π/2] of the product of the complex functions $Z_R(n)$ and $Z_R(n-1)^*$.

The invention also relates to a device for receiving radio-navigation signals by satellite, said received signals being transmitted at a first frequency called carrier frequency, said device including at least means for generating a local signal at a second frequency called local frequency and a tracking device including a feedback loop called carrier loop for phase-locking the local frequency on the carrier frequency, said feedback loop including a hardware portion and a software portion, said hardware portion including at least one integrator which performs the correlation between the local signal and the received signal, the signal obtained from the correlator being called correlated signal, said correlation being performed at high frequency, said software portion performing the functions of discrimination of the phase of the correlated signal and filtering of said phase, the software portion working at low frequency, the duration of a basic computation cycle being denoted T, each cycle being indexed by an integer number n so that the duration of a cycle is included in the time interval [(n−1)T, nT], characterized in that, said time interval being subdivided into M sub-intervals of duration T/M, said sub-intervals being referenced m, the correlated signal at the instant (n+m/M).T being denoted Zp(n, m), then the function Zp'(n) is equal to the sum of the products of Zp(n, m) by a complex exponential function, the argument of which is $-C(n-1)+(m-\frac{1}{2}).[C(n)-C(n-1)]/M$ with C(n) being the linear variation coefficient between the local phases $\phi_{local}$ at the instants nT and (n−1)T such that C(n) is equal to $[\phi_{local}((n+1)T)-\phi_{local}(nT)]/T$, the signal θ(n) obtained from the discrimination being equal to the argument of the product of Zp'(n) multiplied by a complex exponential function $Z_R(n)$, the argument of which is −½.C(n).

Advantageously, when the received phase is shifted, by Doppler effect, at the speed V, the linear variation coefficient C'(n) of the local phase is equal to C(n)+[δ(n+1)−δ(n)] with C(n) equal to [P(n)−P(n−1)]/T and δ(n+1) equal to 3/2.V(n).T, and the discriminator θ'(n) is equal to θ(n)+½[ δ(n−1)+δ(n−2)], with P(n) denoting the value of the phase and V(n) the speed of variation of the phase at the instant nT.

Finally, when the received phase is shifted, by Doppler effect, at the speed V with the acceleration A, the linear variation coefficient C'(n) of the local phase is equal to C(n)+[δ(n+1)−δ(n)] with C(n) equal to [P(n)−P(n−1)]/T and δ(n+1) equal to 3/2.[V(n)+2.A(n).T].T, and the discriminator θ'(n) is equal to θ(n)+½[δ(n−1)+δ(n−2) ], with A(n) denoting the acceleration of the received phase at the instant nT.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

MORE DETAILED DESCRIPTION

A device according to the invention conventionally comprises a hardware part and a software part. Only the software part is novel. Thus, it is possible to exploit the benefits of the device without modifying the hardware part.

In the graphs of FIGS. 6, 7, 8, 12 and 13 which represent variations of the different phases as a function of time, the variations of the phase of the local carrier due to the hardware part are modeled in the form of continuous lines, because the working frequency of the hardware part, between 1 and 100 MHz, is very high compared to that of the software which is approximately 50 Hz. The timescale is subdivided into discrete time intervals nT, n being an integer, each time interval T corresponding to a task of the software. T is commonly 20 ms.

Given a linear variation of the phase variation $\Delta\phi(t)$ over the integration interval $[(n-1)T, nT]$, this assumption is always true for $\phi_{local}(t)$, given the 0 order blocker and the NCO, so, using the same notations as previously, the following can then be expressed:

$$\phi_{local}(t) = \phi_{local}(t_0) + \int_{[t_0,t]} c(\tau)d\tau,$$

either:

$$\phi_{local}(nT) = \phi_{local}((n-1)T) + T.C(n-1)$$

or even:

$$\phi_{local}((n+1)T) = \phi_{local}(nT) + T.C(n)$$

In a misuse of language, the following is written indiscriminately:

$$\phi(nT) = \phi(n) = \phi_n$$

The signal obtained from the integrator has the value:

$$Z_P(n) = \int_{[(n-1)T,nT]} A.\exp i(\phi_{received}(t)).\exp i(-\phi_{local}(t)).dt$$

$$Z_P(n) = \int_{[(n-1)T,nT]} A.\exp i(\phi_{received}(t) - \phi_{local}(t)).dt$$

$$Z_P(n) = \int_{[(n-1)T,nT]} A.\exp i(\Delta\phi(t)).dt$$

with $\Delta\phi(t) = \phi_{received}(t) - \phi_{local}(t)$

Figure 1:
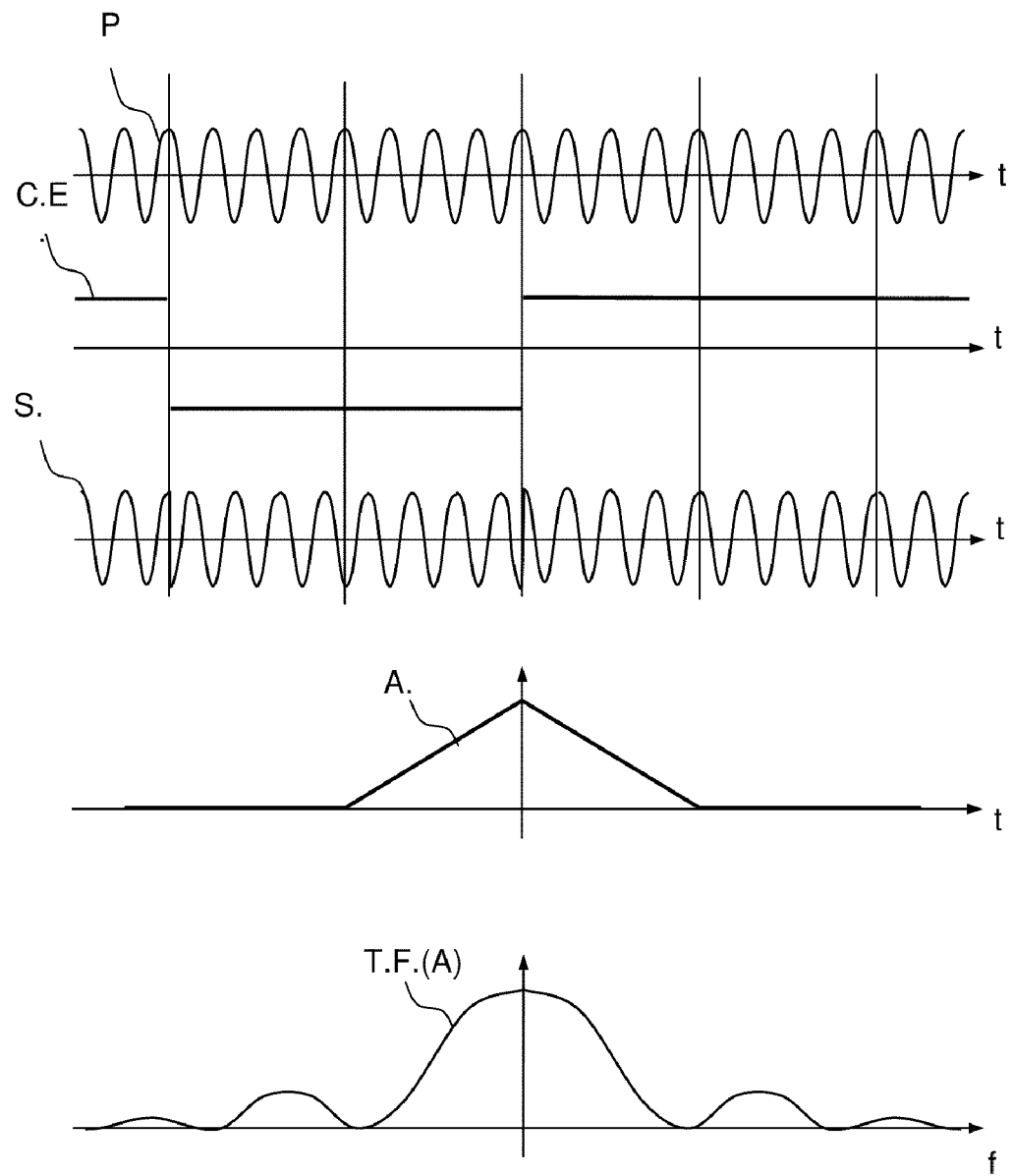
FIG. 1 represents the received signal, its self-correlation function and its Fourier transform.
Figure 2:
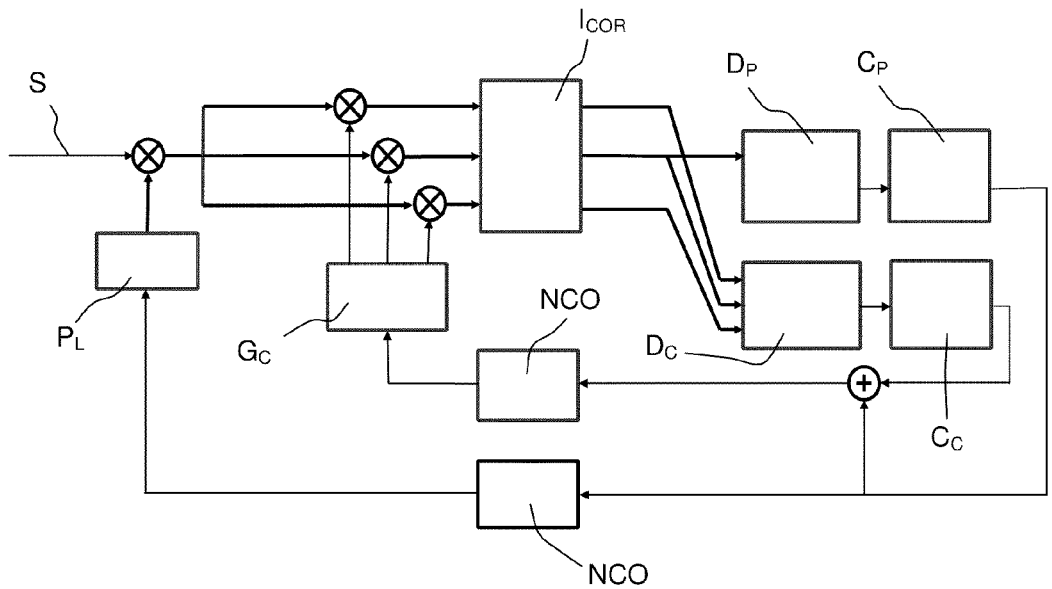
FIG. 2 represents the general block diagram of the tracking devices of a satellite signal receiver.
Figure 3:
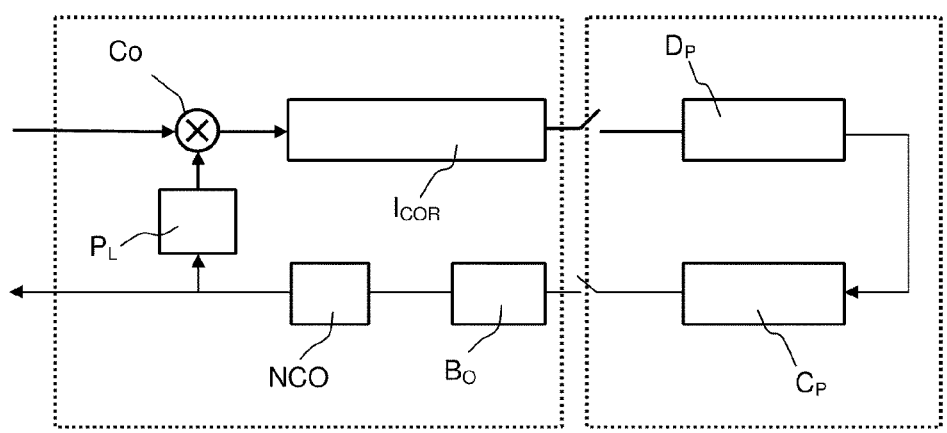
FIG. 3 represents the general block diagram of a feedback loop, called carrier loop.
Figure 4:
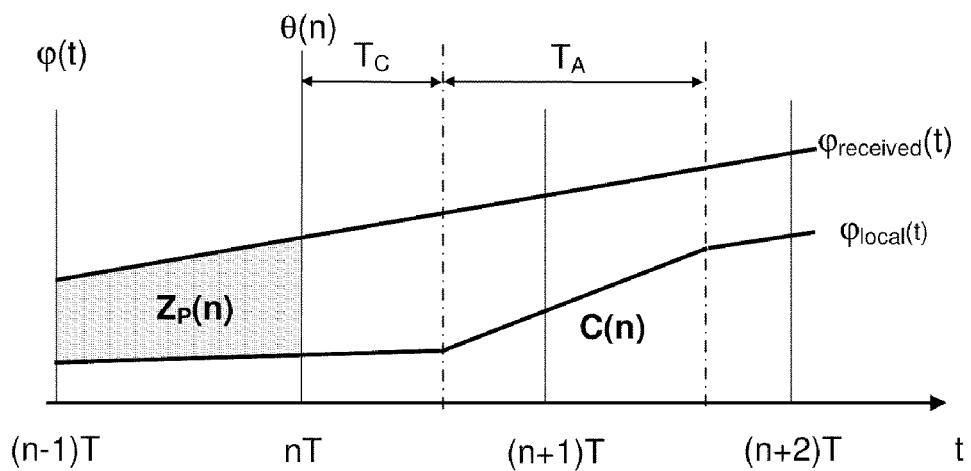
FIG. 4 represents the variations of the different received phases as a function of time in a first reception device according to the prior art.
Figure 5:
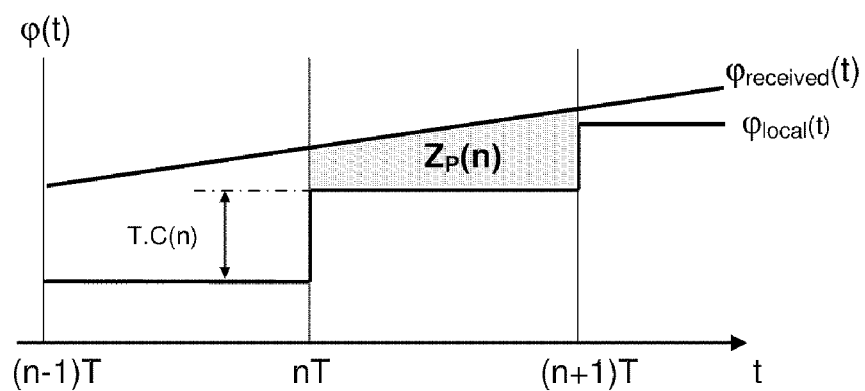
FIG. 5 represents the variations of the different received phases as a function of time in a second reception device according to the prior art.
Figure 6:
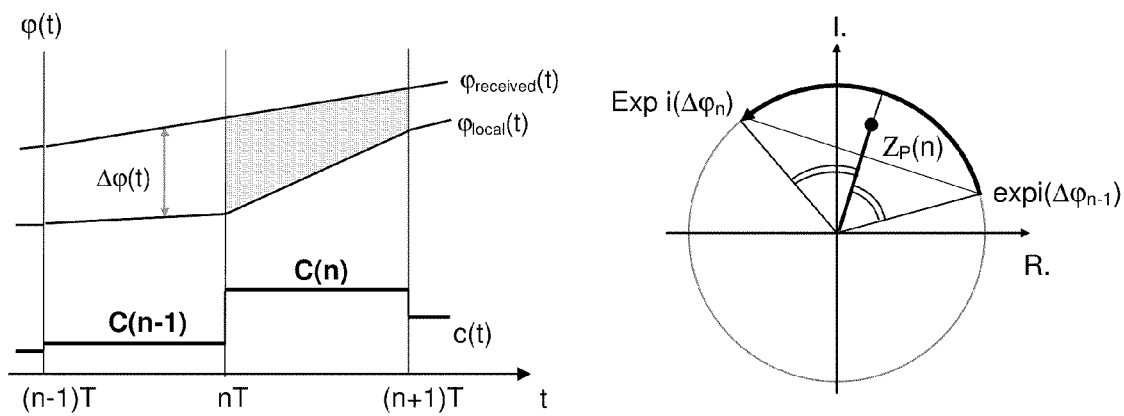
FIG. 6 represents the main parameters representative of the variations of the received and local phases as a function of time in the reception devices according to the invention.

These different parameters are graphically represented in FIG. 6. This comprises two representations: on the left, the variations of the phase as a function of time and on the right the representation of the phase variations and of the signal $Z_P(n)$ in the complex plane (R, I), R representing the real part and I the imaginary part.

It can be shown, by computation, that, given the assumption of a linear variation of $\Delta\phi(t)$ over the integration interval $[(n-1)T, nT]$, the following then applies:

$$Z_P(n) = A.T.\exp i(\tfrac{1}{2}[\Delta\phi(n) + \Delta\phi(n-1)]).\text{sinc}(\tfrac{1}{2}[\Delta\phi(n) - \Delta\phi(n-1)])$$

The terms expi and sinc represent the conventional abbreviations of the complex exponential and of the cardinal sine.

The argument of $Z_P(n)$ is that of the factor $\exp i(\tfrac{1}{2}[\Delta\phi(n) + \Delta\phi(n-1)])$. The term $\tfrac{1}{2}[\Delta\phi(n) + \Delta\phi(n-1)]$ is thus determined, which is the average of the difference between the received phase and the local phase over the integration interval. The argument of $Z_P(n)$ is represented in the different figures representing the phase variations by a shaded area.

The real factor $\text{sinc}(\tfrac{1}{2}[\Delta\phi(n) - \Delta\phi(n-1)])$ which disappears in the argument, constitutes the Doppler loss, which reduces the amplitude of the signal after the coherent integration, which can be a real problem when it comes to the robustness to noise.

We assume:

$$\theta(n) = \arg(Z_P(n)), \text{ or:}$$

$$\theta(n) = \tfrac{1}{2}[\Delta\phi_n + \Delta\phi_{n-1}]$$

$$\theta(n) = \tfrac{1}{2}[\phi_{received}(nT) + \phi_{received}((n-1)T)] - \tfrac{1}{2}[\phi_{local}(nT) + \phi_{local}((n-1)T)]$$

The loop corrector is implemented by the following 3 steps from the instant nT:

$$A(n+1) = A(n) + T.K3.\theta(n)$$

$$V(n+1) = V(n) + T.A(n) + T.K2.\theta(n)$$

$$P(n+1) = P(n) + T.V(n) + T.K1.\theta(n)$$

With A(n), V(n), P(n) respectively representing an estimate of the acceleration, speed and position of the phase.

The compensation command can be applied either without delay or with delay.

In the former case, the command is applied over the integration interval $[nT, (n+1)T]$, and the following applies:

$$C(n) = [P(n+1) - P(n)]/T = V(n) + K1.\theta(n)$$

$$C(n) = [\phi_{ideal\ local}((n+1)T) - \phi_{ideal\ local}(nT)]/T$$

$$C(n) = [\phi_{local}((n+1)T) - \phi_{local}(nT)]/T$$

$$P(n) = \phi_{ideal\ local}(nT) = \phi_{local}(nT)$$

In the latter case, the command is applied over the integration interval $[(n+1)T, (n+2)T]$, and the following applies:

$$C(n+1) = [P(n+1) - P(n)]/T = V(n) + K1.\theta(n)$$

$$C(n+1) = [\phi_{ideal\ local}((n+1)T) - \phi_{ideal\ local}(nT)]/T$$

$$C(n+1) = [\phi_{local}((n+2)T) - \phi_{local}((n+1)T)]/T$$

$$P(n) = \phi_{ideal\ local}(nT) = \phi_{local}((n+1)T)$$

In state representations, the loop corrector can be represented as follows:

System input:

$$E(n) = \phi_{received}(nT)$$

Initial states of the loop corrector at the time nT: A(n), V(n) and P(n) respectively representing the acceleration, speed and position.

Corrector output:

$$P(n) = \phi_{local}((n+1)T)$$

Comparator:

$$\theta(n) = \tfrac{1}{2}[E(n) + E(n-1)] - \tfrac{1}{2}[P(n-1) + P(n-2)]$$

Loop corrector:

$$A(n+1) = A(n) + T.K3.\theta(n)$$

$$V(n+1) = V(n) + T.A(n) + T.K2.\theta(n)$$

$$P(n+1) = P(n) + T.V(n) + T.K1.\theta(n)$$

The comparator $\theta(n)$ supplies a measurement of the difference between the average received phase $\tfrac{1}{2}[E(n) + E(n-1)]$ and the last delayed average local phase $\tfrac{1}{2}[P(n-1) + P(n-2)]$.

Ideally, with no delay, the following condition would need to be satisfied:

$$\theta(n)=\frac{1}{2}[E(n)+E(n-1)]-P(n)$$

$$\theta(n)=\frac{1}{2}[\phi_{received}(nT)+\phi_{received}((n-1)T)]-\phi_{local}((n+1)T)$$

$$\theta(n)=\frac{1}{2}[\phi_{received}(nT)+\phi_{received}(n-1)T)]-\phi_{ideal}(nT)$$

There are thus the following 2 delays:
NCO delay:

$$P(n)-\frac{1}{2}[P(n)+P(n-1)]$$

Computation delay:

$$\frac{1}{2}[P(n)+P(n-1)]-\frac{1}{2}[P(n-1)+P(n-2)]$$

The core function of the device according to the invention is to correct the discriminator so that the delays are best compensated. It is demonstrated that the correction to be made depends only on the current or old commands which are perfectly well known. The device does not correct the delay on the local phase of the NCO output, but this renders the closed loop mode behavior much more stable, including with larger loop bands. The delay on the local phase of the NCO output, proportional to the Doppler, can nevertheless be corrected in advance.

In the basic solution of the device according to the invention, the delays are compensated in the discriminator. In addition to the received phase and the local phase produced by the NCO, two imaginary phases are considered:
  the ideal phase, which is the local phase that would be obtained without any command application delay;
  the virtual phase, which is the local phase that would be obtained without any command application delay and with an instantaneous realignment hop-wise, and not speed-wise.

Figure 7:
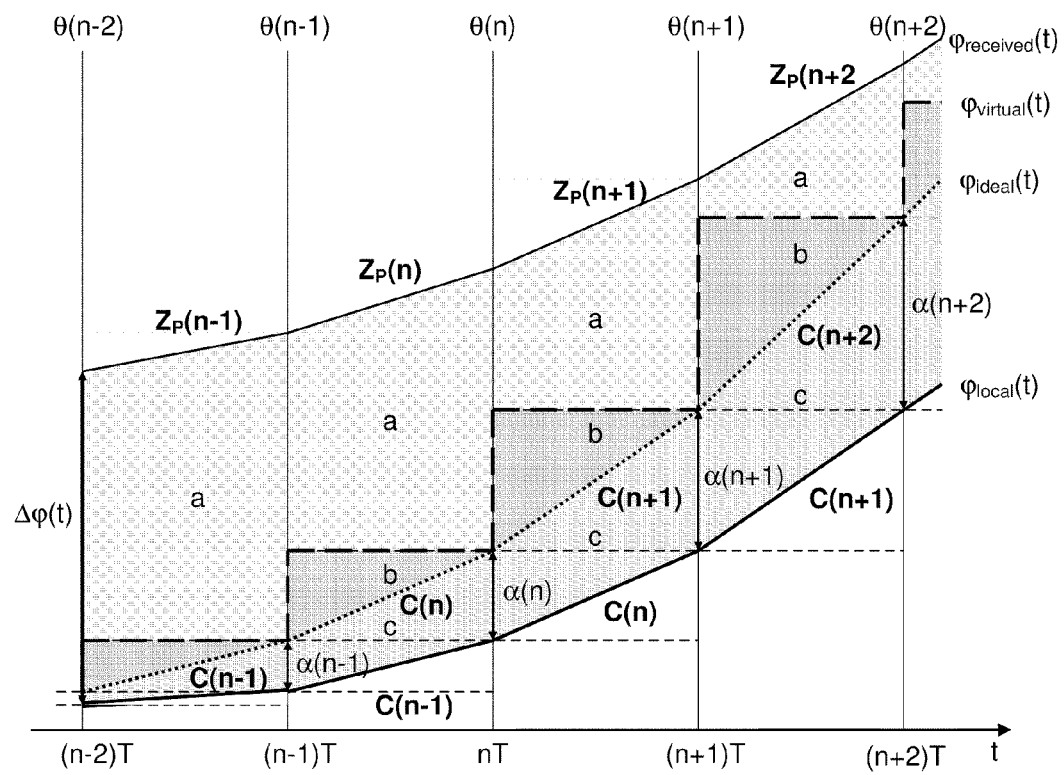
FIG. 7 represents the variations of the different received phases as a function of time in a first embodiment of a reception device according to the invention.

These different phases are represented in FIG. 7.
We have:

$$Z_P(n)=\int_{[(n-1)T,nT]}A.\text{expi}(\phi_{received}(t)-\phi_{local}(t))dt$$

or else:

$$Z_P(n)=A.T.\text{expi}(\frac{1}{2}[\Delta\phi(n)+\Delta\phi(n-1)]).\text{sinc}(\frac{1}{2}[\Delta\phi(n)-\Delta\phi(n-1)])$$

with $\Delta\phi(n)=\phi_{received}(n-1)-\phi_{local}(n)$

We want:

$$\theta(n)=\frac{1}{2}[\phi_{received}(n-1)+\phi_{received}(n)]-\phi_{ideal}(n)$$

"a" denotes this value as represented in FIG. 7.
We already have:

$$\arg(Z_P(n))=\frac{1}{2}[\phi_{received}(n-1)+\phi_{received}(n)]-\frac{1}{2}[\phi_{local}(n-1)+\phi_{local}(n)]$$

$$\arg(Z_P(n))=a+b+c$$

$$a=\frac{1}{2}[\phi_{received}(n-1)+\phi_{received}(n)]-\phi_{ideal}(n)$$

$$b=\frac{1}{2}[\phi_{ideal}(n)-\phi_{ideal}(n-1)]$$

$$c=\frac{1}{2}[\phi_{ideal}(n)+\phi_{ideal}(n-1)]-\frac{1}{2}[\phi_{local}(n-1)+\phi_{local}(n)]$$

$$b=\frac{1}{2}[\phi_{local}(n+1)-\phi_{local}(n)]$$

$$c=\frac{1}{2}[\phi_{ideal}(n-1)-\phi_{local}(n-1)]+\frac{1}{2}[\phi_{ideal}(n)-\phi_{local}(n)]$$

or: $\theta(n)=\arg(Z_P(n))-b-c$

The aim is to express b and c as a function of the preceding loop corrector commands:

$$b=\frac{1}{2}C(n)$$

or $\alpha(n)=\phi_{ideal}(n)-\phi_{local}(n)$ $$c=\frac{1}{2}[\alpha(n-1)+\alpha(n)]$$

$\alpha(n)$ is constructed by recurrence:

$$\alpha(n)=\alpha(n-1)+C(n)-C(n-1)$$

If $\alpha(0)=0$, $C(0)=0$, $C(1)=0$ then $\alpha(n)=C(n)$ for any n.
Therefore $$c=\frac{1}{2}[C(n-1)+C(n)]$$

$$\theta(n)=\arg(Z_P(n))-C(n)-\frac{1}{2}C(n-1)$$

$$\theta(n)=\arg(Z_P(n))-\text{Compensation}(n)$$

with Compensation$(n)=C(n)+\frac{1}{2}C(n-1)$

In practice, when the argument of $Z_P(n)$ is taken out, the interval to be used must first be decided: $[\Delta-\pi, \Delta+\pi]$. This interval must be centered around the most probable value $\Delta$ of Arg($Z_P(n)$), in order to minimize the risk of tilting to the other side because of the noise or the dynamics. A tilt induces an error of $2\pi$.

The most probable value of Arg($Z_P(n)$), given the NCO commands already applied, happens to be Compensation(n). It is therefore sufficient to do:

$$Z_C(n)=\text{expi}(\text{Compensation}(n))$$

$$Z_R(n)=Z_P(n).Z_C(n)^*$$

If there is no data (pilot channel):

$$\theta(n)=\arg_{[-\pi,\pi]}(Z_R(n))=\arg_{[-\pi,\pi]}[Z_P(n).\text{expi}(-C(n)-\frac{1}{2}C(n-1))]$$

If there is data:

$$\theta(n)=\arg_{[-\pi/2,\pi/2]}(Z_R(n))=\arg_{[-\pi/2,\pi/2]}[Z_P(n)\text{expi}(-C(n)-\frac{1}{2}C(n-1))]$$

Figure 8:
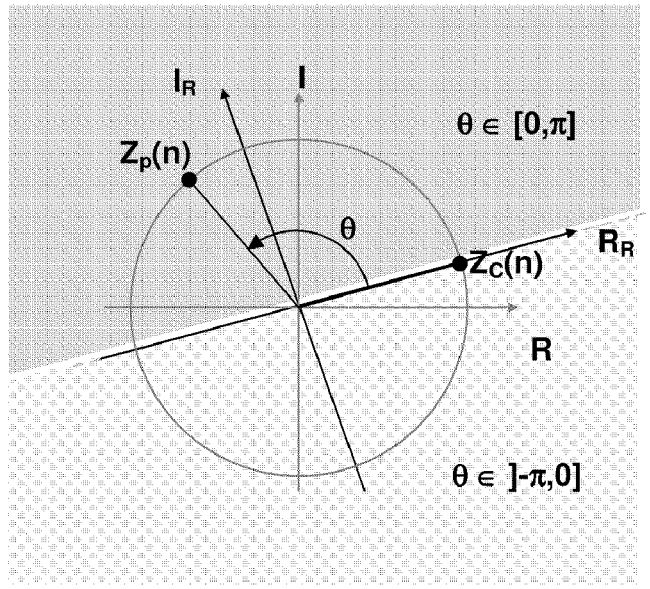
FIGS. 8 and 9 represent the parameters Zp(n) and Zc(n) in a complex plane.
Figure 9:
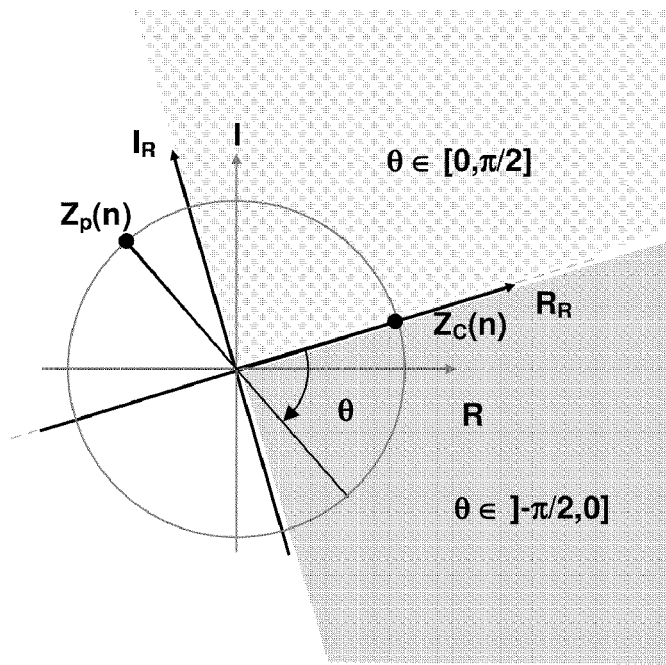

These two cases are illustrated in FIGS. 8 and 9 where the signals $Z_P(n)$ and $Z_C(n)$ are represented in the complex plane (R, I).

If the system has to tolerate a greater phase error due, for example, to the dynamics-induced drag and greater than the interval $[-\pi,\pi]$, a discriminator is used that can withstand a greater loop error. It consists in counting the number of turns and supplies an angle $\theta$ outside the interval $[-\pi,+\pi]$: this discriminator is called "winding discriminator" or "extended discriminator". The following apply:

$$Z_R(n-1)=Z_P(n-1).Z_C(n-1)^*$$

and $$Z_R(n)=Z_P(n).Z_C(n)^*$$

In this case, with data, the following applies:

$$\theta(n)=\arg_{[-\pi,\pi]}(Z_R(n).Z_R(n-1)^*)+\theta(n-1)$$

Without data, the following applies:

$$\theta(n)=\arg_{[-\pi/2,\pi/2]}(Z_R(n).Z_R(n-1)^*)+\theta(n-1)$$

Figure 10:
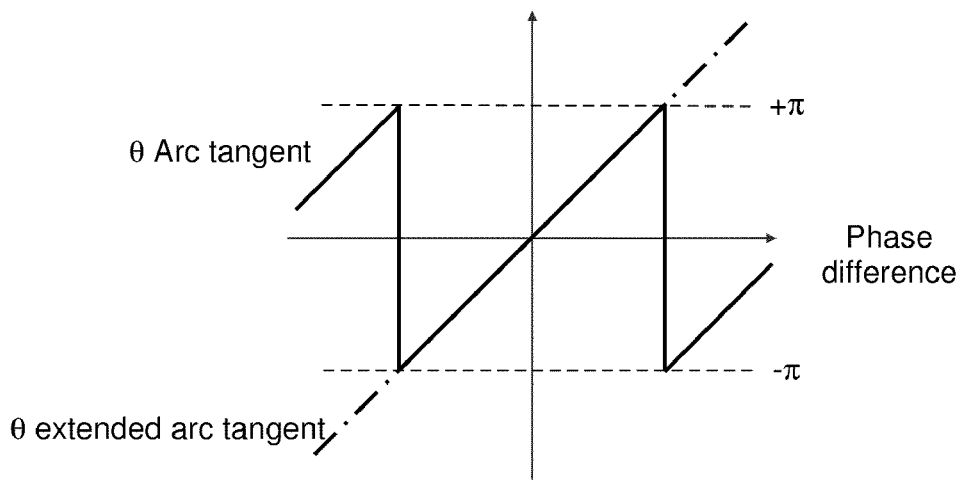
FIGS. 10 and 11 represent the trends of the discriminator as a function of the phase difference.
Figure 11:
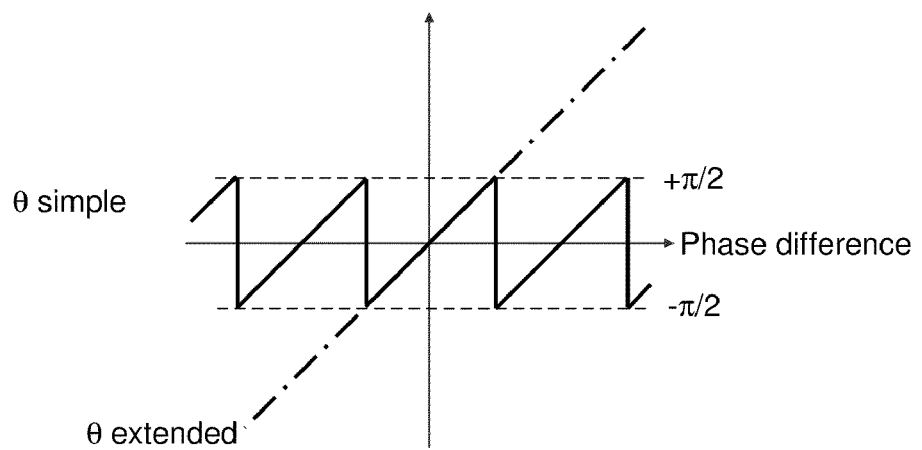
Figure 12:
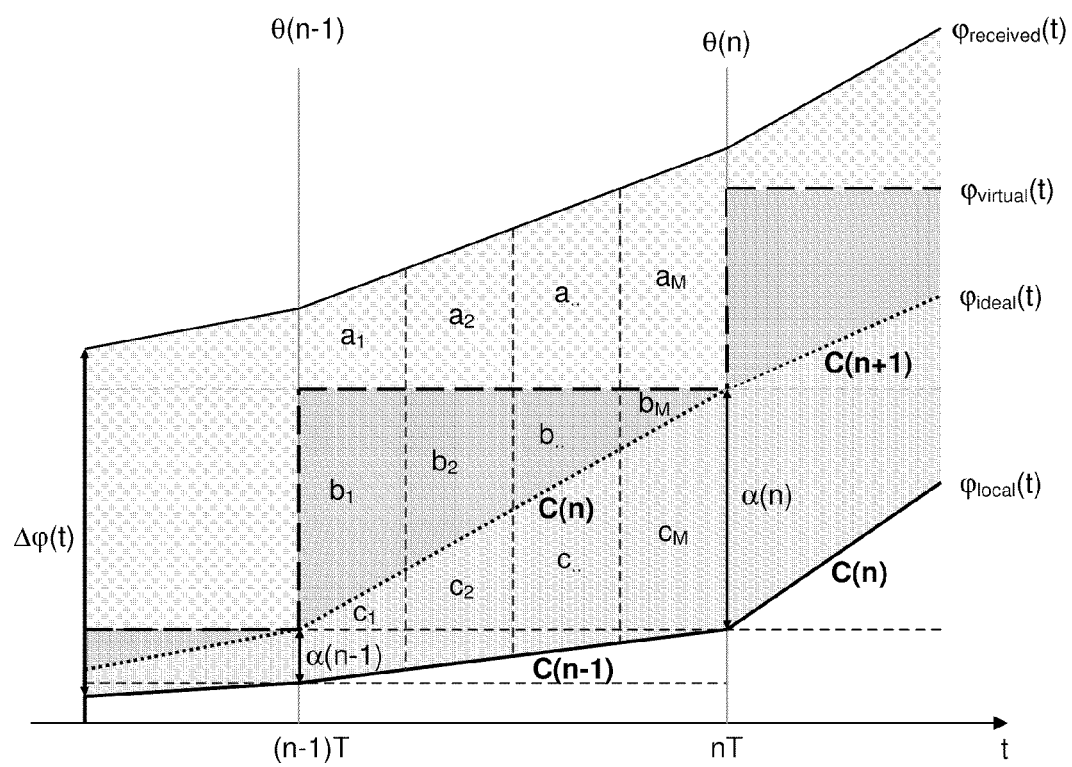
FIG. 12 represents the variations of the different received phases as a function of time in a second embodiment of a reception device according to the invention.
Figure 13:
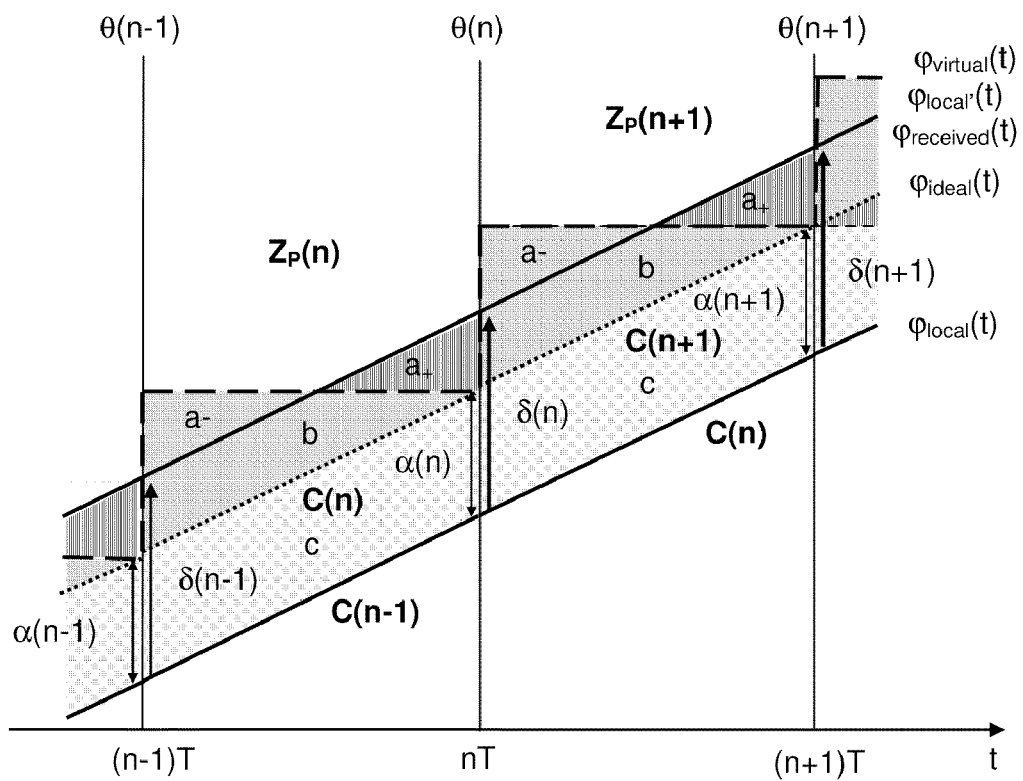
FIG. 13 represents the variations of the different received phases as a function of time in a third embodiment of a reception device according to the invention.

FIGS. 10 and 11 show, in solid lines, the variations of $\theta(n)$ as a function of the phase difference when they are calculated based on the value of the argument, these variations being denoted 8 simple, and in dotted lines, the variations of $\theta(n)$ when they are calculated based on the value of the argument but taking into account preceding values, these variations being denoted 8 extended.

This discriminator provides a way of increasing the robustness to dynamics without changing the loop band or the pre-detection band. It does not introduce additional workloads at software level. However, it reduces the robustness to noise. Cycle jumps or cycles of loop synchronization become possible.

It is possible to further improve the discriminator according to the invention. A first improvement consists in compensating the Doppler losses. The correction made by the discriminator compensates the delay within the loop from the point of view of the dynamic behavior. However, the local phase is not affected. The local carrier frequency remains delayed relative to the received carrier, which can increase the Doppler losses in the presence of high acceleration where the factor sinc ($\frac{1}{2}\Delta\phi(n)-\frac{1}{2}\Delta\phi(n-1)$) becomes small because of $\frac{1}{2}\Delta\phi(n)-\frac{1}{2}\Delta\phi(n-1)$ containing $\frac{1}{2}C(n)-\frac{1}{2}C(n-1)$ which becomes great. In order to limit the Doppler losses, the interval $[(n-1)T, nT]$ is subdivided into M sub-intervals of length $T/M$ and M basic integrations $Z_P(n,m)$ are performed, with m equal to 1, 2, ..., M.

The following then applies:

$$Z_P(n)=\Sigma_{m=1,2,\ldots,M}Z_P(n,m)$$

with $$Z_P(n,m)=\int_{[(n-1)T+(m-1)T/M,(n-1)T+mT/M]}\text{expi}(\phi_{received}(t)-\phi_{local}(t)).dt$$

Or else:

$$Z_P(n,m)=A.T/M.\text{expi}(\tfrac{1}{2}[\Delta\phi(n-1,m)+\Delta\phi(n-1,m-1)]).\text{sinc}(\tfrac{1}{2}[\Delta\phi(n-1,m)-\Delta\phi(n-1,m-1)])$$

The complex exponential and cardinal sine expression is found with:

$$\Delta\phi(n,m)=\Delta\phi(nT+m.T/M)=\phi_{received}(n,m)-\phi_{local}(n,m)$$

and $$\arg(Z_P(n,m))=\tfrac{1}{2}[\Delta\phi(n-1,m)+\Delta\phi(n-1,m-1)]$$

$$\arg(Z_P(n,m))/=\tfrac{1}{2}[\phi_{received}(n-1,m)+\phi_{received}(n-1,m-1)]-\tfrac{1}{2}[\phi_{local}(n-1,m-1)+\phi_{local}(n-1,m)]$$

$\arg(Z_P(n,m))$ is broken down into 3 terms:

$$\arg(Z_P(n,m))=a_m+b_m+c_m$$

with $$a_m=\tfrac{1}{2}[\phi_{received}(n-1,m)+\phi_{received}(n-1,m-1)]-\phi_{virtual}(n-1,m)$$

$$b_m=\phi_{virtual}(n-1,m)-\tfrac{1}{2}[\phi_{ideal}(n-1,m)+\phi_{ideal}(n-1,m-1)]$$

$$c_m=\tfrac{1}{2}[\phi_{ideal}(n-1,m)+\phi_{ideal}(n-1,m-1)]-\tfrac{1}{2}[\phi_{local}(n-1,m-1)+\phi_{local}(n-1,m)]$$

And the following can be written:

$$Z_P(n,m)=A.T/M.\text{expi}(a_m+b_m+c_m).\text{sinc}(\Delta)$$

with $$\text{sinc}(\Delta)=\text{sinc}(\tfrac{1}{2}[\Delta\phi(n-1,m)-\Delta\phi(n-1,m-1)])$$

This expression is independent of m inasmuch as the variations of $\Delta\phi$ are linear.

As previously, each $Z_P(n,m)$ of the quantity $c_m$ is corrected, and integration is done. The following is obtained:

$$Z_P'(n)=\Sigma_{m=1,2,\ldots,M}Z_P(n,m).\text{expi}(-c_m)$$

$$Z_P'(n)=\Sigma_{m=1,2,\ldots,M}A.T/M.\text{expi}(a_m+b_m).\text{sinc}(\Delta)$$

$Z_P'(n)$ is calculated, assuming a linear variation over the interval $[(n-1)T, nT]$:

$$Z_P'(n)=A.T.\text{expi}(\tfrac{1}{2}[(a_1+b_1)+(a_M+b_M)]).\text{sinc}_M(\tfrac{1}{2}[(a_1+b_1)-(a_M+b_M)]).\text{sinc}(\Delta)$$

with $$\text{sinc}_M(x)=\sin(x.(M+1)/M)/\sin(x/M)/M\cong\text{sinc}(x)\text{ if M is great}$$

$$\text{sinc}_M(\tfrac{1}{2}[(a_1+b_1)-(a_M+b_M)])\cong\text{sinc}(\tfrac{1}{2}[\Delta'\phi(n)-\Delta'\phi(n-1)])\text{ if M is great}$$

and $$\text{expi}(\tfrac{1}{2}[(a_1+b_1)+(a_M+b_M)])=\text{expi}(\tfrac{1}{2}[\Delta'\phi(n)+\Delta'\phi(n-1)])$$

with $$\Delta'\phi(n)=\phi_{received}(n)-\phi_{ideal}(n)$$

hence $$Z_P'(n)=A.T.\text{expi}(\tfrac{1}{2}[\Delta'\phi(n)+\Delta'\phi(n-1)]).\text{sinc}(\tfrac{1}{2}[\Delta'\phi(n)-\Delta'\phi(n-1)]).\text{sinc}(\Delta)$$

The two factors of the expression of $Z_P(n)$ seen previously are found, but this time the Doppler loss represented by the cardinal sine factor is no longer between the received phase and the local phase, but between the received phase and the ideal phase without delay. It is therefore less great. The factor $\text{sinc}(\Delta)$ also represents a Doppler loss between the received phase and the local phase, but over a shorter duration, and therefore much less sensitive than when an overall correction is made. The following therefore applies:

$$\arg(Z_P'(n))=\tfrac{1}{2}[\phi_{received}(n-1)+\phi_{received}(n)]-\tfrac{1}{2}[\phi_{ideal}(n-1)+\phi_{ideal}(n)]$$

or else:

$$\arg(Z_P'(n))=a+b$$

As previously, the following is required:

$$\theta(n)=a$$

All that now remains is to correct the quantity b:

$$\theta(n)=\arg(Z_P'(n))-b$$

$$\theta(n)=\arg(Z_P'(n))-\tfrac{1}{2}C(n)$$

or else:

$$\theta(n)=\arg[Z_P'(n).\text{expi}(-\tfrac{1}{2}C(n))]$$

The terms $c_m$ are calculated. Assuming a linear variation from $\alpha(n)$ to $\alpha(n-1)$ over the interval $[(n-1)T, nT])$, the following can be stated:

$$c_m=\alpha(n-1)+(m-\tfrac{1}{2}).\beta(n-1)$$

with $\alpha(n-1)=C(n-1)$ and $\beta(n-1)=[\alpha(n)-\alpha(n-1)]/M$

If M is great, the following can be written:

$$Z_P(n,m)=\int_{[(n-1)T+(m-1)T/M,(n-1)T+mT/m]}\text{expi}(\phi_{received}(t)-\phi_{local}(t)).dt$$

$$Z_P(n,m)\cong A.T/M.\text{expi}(\phi_{received}(t_m)-\phi_{local}(t_m))$$

with $t_m=(n-1)T+(m-\tfrac{1}{2})T/M$ $$Z_P'(n)=\Sigma_{m=1,2,\ldots,M}Z_P(n,m).\text{expi}(-c_m)$$

$$Z_P'(n)\cong\Sigma_{m=1,2,\ldots,M}A.T/M.\text{expi}(\phi_{received})(t_m)-\phi_{local})(t_m).\text{expi}(-\phi_{ideal})(t_m)+\phi_{local}(t_m))$$

$$Z_P'(n)\cong\int_{[(n-1)T,nT]}A.\text{expi}(\phi_{received})(t)-\phi_{ideal}(t)).dt$$

The expression of $Z_P(n)$ is found if $\phi_{ideal}(t)$ is replaced with $\phi_{local}(t_m)$. Everything takes place as if there were no delay in the application of the NCO command.

Therefore, finally, the following expressions apply:

$Z_P(n,m) = \int_{[(n-1)T+(m-1)T/M, (n-1)T+mT/M]} \exp i(\phi_{received}(t) - \phi_{local}(t)).dt$ $\alpha(n-1) = C(n-1)$ $\beta(n-1) = [C(n) - C(n-1)]/M$ and $Z_{P'}(n) = \Sigma_{m=1,2,\ldots M} Z_P(n,m).\exp i(-\alpha(n-1) + (m-\frac{1}{2}).\beta(n-1))$ $\theta(n) = \text{Arg}[Z_{P'}(n).\exp i(-\frac{1}{2}C(n))]$ The practical implementation poses no particular technical problems. Every $Z_P(n,m)$, given $m=1, 2, \ldots, M$, is produced by the hardware part and supplied to the software in packets at the end of each time interval $[(n-1)T, nT]$. $Z_{P'}(n)$ is calculated by the software.

As an example, the following can be taken as meaningful values:

T=20 ms

M=20, or T/M=1 ms

There is a second possible path for improvement which consists in anticipating the delays on the local phase. The correction applied to the discriminator does not change the delay on the local phase. However, it is possible to compensate this delay, which is $\delta=3/2.V.T$ in the presence of Doppler V, in advance.

The command $C'(n)$ is applied to the NCO, instead of the command $C(n)$ over the interval $[nT, (n+1)T]$ with:

$C'(n) = C(n) + \delta(n+1) - \delta(n)$

This command is calculated from the data available at the instant (n−1)T:

$A(n) = A(n-1) + T.K3.\theta'(n-1)$ $V(n) = V(n-1) + T.A(n-1) + T.K2.\theta'(n-1)$ $P(n) = P(n-1) + T.V(n-1) + T.K1.\theta'(n-1)$ Hence:

$C(n) = [P(n) - P(n-1)]/T$ $\delta(n) = 3/2.V(n-1).T$ $\delta(n+1) = 3/2.V(n).T$ In order not to disturb the behavior of the loop, the coherence of the discriminator is corrected:

$\theta'(n) = \theta(n) + \frac{1}{2}[\delta(n-1) + \delta(n-2)]$

This compensation of the delay on the local phase works perfectly in steady state operation at constant (Doppler) speed. In steady state operation with constant acceleration, the variation of the speed V between the middle of the interval $[(n-2)T, (n-1)T]$ and the middle of the interval $[nT, (n+1)T]$ can be anticipated, as follows:

$\delta(n) = 3/2[V(n-1) + 2.A(n-1).T].T$ $\delta(n+1) = 3/2[V(n) + 2.A(n).T].T$

For example, in the case of a signal without data corresponding to the pilot channel, with a pre-detection band of 50 Hz corresponding to a period T of 20 milliseconds, and gains K1, K2, K3 optimized for holding at an acceleration level, the device tolerates an instantaneous jump in acceleration of 24 g, compared to 4 g for a conventional loop.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A device for receiving radio-navigation signals by satellite, said received signals being transmitted at a first frequency or carrier frequency, said device comprising:
   at least means for generating a local signal at a second frequency or local frequency and
   a tracking device including a feedback loop, for phase-locking the local frequency on the carrier frequency, said feedback loop including a hardware portion and a software portion, said hardware portion comprising at least one integrator which performs the correlation between the local signal and the received signal, the signal deriving from the correlation being called correlated signal, said correlation being performed at high frequency, said software part performing functions of discriminating the phase of the correlated signal and filtering said phase, the software portion working at low frequency, the duration of a basic computation cycle being denoted T, each cycle being indexed by an integer number n so that the duration of a cycle is contained in the time interval $[(n-1)T, nT]$, the correlated signal at the instant nT being denoted $Z_p(n)$, the signal $\theta(n)$ deriving from the discrimination being equal to the argument of the product of $Z_p(n)$ multiplied by a complex exponential function $Z_R(n)$, the argument of which is a compensation term that is a function of n and of T,
   wherein, if C(n) is used to denote the linear variation coefficient of the phase of the local frequency $\phi_{local}$ between the instants nT and (n+1)T such that $[\phi_{local}((n+1)T) - \phi_{local}(nT)]/T$ is equal to C(n), C(n) being calculated previously from data available respectively at the instant (n−1)T and concerning the value of the received phase, its position and its acceleration, then said compensation term depends at least on C(n) and C(n−1).

2. The device as claimed in claim 1, wherein the compensation term is equal to the opposite of the sum of C(n) and ½ C(n−1).

3. The device as claimed in claim 1, wherein, when the received signal does not include data, the signal $\theta(n)$ obtained from the discrimination is equal to the signal $\theta(n-1)$ plus the argument taken over the interval $[-\pi, +\pi]$ of the product of the complex functions $Z_R(n)$ and $Z_R(n-1)^*$.

4. The device for receiving radio-navigation signals by satellite as claimed in claim 1, wherein, when the received signal includes data, the signal $\theta(n)$ obtained from the discrimination is equal to the signal $\theta(n-1)$ plus the argument taken over the range $[-\pi/2, +\pi/2]$ of the product of the complex functions $Z_R(n)$ and $Z_R(n-1)^*$.

5. The device as claimed in claim 1, wherein, when the received phase is shifted, by Doppler effect, at the speed V, the linear variation coefficient C'(n) of the local phase is equal to $C(n) + [\delta(n+1) - \delta(n)]$ with C(n) equal to $[P(n) - P(n-1)]/T$ and $\delta(n+1)$ equal to 3/2.V(n).T, and, coherently, the new discriminator $\theta'(n)$ is equal to $\theta(n) + \frac{1}{2}[\delta(n-1) + \delta(n-2)]$, P(n) denoting the value of the phase and V(n) the speed of variation of the phase at the instant nT, and $\delta = 3/2.V.T$.

6. The device as claimed in claim 5, wherein, when the received phase is shifted, by Doppler effect, at the speed V with the acceleration A, the linear variation coefficient C'(n)

of the local phase is equal to $C(n)+[\delta(n+1)-\delta(n)]$ with $C(n)$ equal to $[P(n)-P(n-1)]/T$ and $\delta(n+1)$ equal to $3/2.[V(n)+2.A(n).T].T$, and, coherently, the new discriminator $\theta'(n)$ is equal to $\theta(n)+\frac{1}{2}[\delta(n-1)+\delta(n-2)]$, $A(n)$ denoting the acceleration of the received phase at the instant $nT$, and $\delta=3/2.V.T$.

7. The device as claimed in claim 2, wherein, when the received phase is shifted, by Doppler effect, at the speed V, the linear variation coefficient $C'(n)$ of the local phase is equal to $C(n)+[\delta(n+1)-\delta(n)]$ with $C(n)$ equal to $[P(n)-P(n-1)]/T$ and $\delta(n+1)$ equal to $3/2.V(n).T$, and, coherently, the new discriminator $\theta'(n)$ is equal to $\theta(n)+1/2[\delta(n-1)+\delta(n-2)]$, $P(n)$ denoting the value of the phase and $V(n)$ the speed of variation of the phase at the instant $nT$, and $\delta=3/2.V.T$.

8. The device as claimed in claim 3, wherein, when the received phase is shifted, by Doppler effect, at the speed V, the linear variation coefficient $C'(n)$ of the local phase is equal to $C(n)+[\delta(n+1)-\delta(n)]$ with $C(n)$ equal to $[P(n)-P(n-1)]/T$ and $\delta(n+1)$ equal to $3/2.V(n).T$, and, coherently, the new discriminator $\theta'(n)$ is equal to $\theta(n)+\frac{1}{2}[\delta(n-1)+\delta(n-2)]$, $P(n)$ denoting the value of the phase and $V(n)$ the speed of variation of the phase at the instant $nT$, and $\delta=3/2.V.T$.

9. The device as claimed in claim 4, wherein, when the received phase is shifted, by Doppler effect, at the speed V, the linear variation coefficient $C'(n)$ of the local phase is equal to $C(n)+[\delta(n+1)-\delta(n)]$ with $C(n)$ equal to $[P(n)-P(n-1)]/T$ and $\delta(n+1)$ equal to $3/2.V(n).T$, and, coherently, the new discriminator $\theta'(n)$ is equal to $\theta(n)+\frac{1}{2}[\delta(n-1)+\delta(n-2)]$, $P(n)$ denoting the value of the phase and $V(n)$ the speed of variation of the phase at the instant $nT$, and $\delta=3/2.V.T$.

10. A device for receiving radio-navigation signals by satellite, said received signals being transmitted at a first frequency or carrier frequency, said device comprising:

at least means for generating a local signal at a second frequency or local frequency and a tracking device including a feedback loop for phase-locking the local frequency on the carrier frequency, said feedback loop including a hardware portion and a software portion, said hardware portion including at least one integrator which performs the correlation between the local signal and the received signal, the signal obtained from the correlation being called correlated signal, said correlation being performed at high frequency, said software portion performing the functions of discrimination of the phase of the correlated signal and filtering of said phase, the software portion working at low frequency, the duration of a basic computation cycle being denoted T, each cycle being indexed by an integer number n so that the duration of a cycle is included in the time interval $[(n-1)T, nT]$, wherein, said time interval being subdivided into M sub-intervals of duration $T/M$, said sub-intervals being referenced m which equals to $1, 2, \ldots, M$, the correlated signal at the instant $(n+m/M).T$ being denoted $Zp(n, m)$, then the function $Zp'(n)$ is equal to the sum of the products of $Zp(n, m)$ by a complex exponential function, the argument of which is $-C(n-1)+(m-\frac{1}{2}).[C(n)-(n-1)]/M)$ with $C(n)$ being the linear variation coefficient of the phase of the local frequency $\phi_{local}$ between the instants $nT$ and $(n+1)T$ such that $[\phi_{local}((n+1)T)-\phi_{local}(nT)]/T$ is equal to $C(n)$, $C(n)$ being calculated previously from data available at the instant $(n-1)T$, the signal $\theta(n)$ obtained from the discrimination being equal to the argument of the product of $Zp'(n)$ multiplied by a complex exponential function $Z_R(n)$, the argument of which is $-\frac{1}{2}.C(n)$.

* * * * *